United States Patent [19]
Jiang et al.

[11] Patent Number: 5,966,399
[45] Date of Patent: Oct. 12, 1999

[54] VERTICAL CAVITY SURFACE EMITTING LASER WITH INTEGRATED DIFFRACTIVE LENS AND METHOD OF FABRICATION

[75] Inventors: Wenbin Jiang, Phoenix; Michael S. Lebby, Apache Junction, both of Ariz.

[73] Assignee: Motorola, Inc., Schaumburg, Ill.

[21] Appl. No.: 08/942,886

[22] Filed: Oct. 2, 1997

[51] Int. Cl.$^6$ .................................. H01S 3/08; H01S 3/19
[52] U.S. Cl. .................................. 372/96; 372/46; 372/99
[58] Field of Search .................................. 372/45, 46, 50, 372/99, 96

[56] References Cited

U.S. PATENT DOCUMENTS 5,426,657  6/1995  Vakhshoori ................................. 372/45
5,838,715  11/1998  Corzine et al. ........................... 372/96

Primary Examiner—James W. Davie
Attorney, Agent, or Firm—Eugene A. Parsons; William E. Koch

[57] ABSTRACT

VCSEL with integrated lens element and method of fabrication including a substrate element, a first stack of distributed Bragg reflectors disposed on a surface of the substrate element, an active region lattice matched to a surface of the first stack of distributed Bragg reflectors, and a second stack of distributed Bragg reflectors lattice matched to a surface of the active region. The active region includes at least one quantum well layer and a plurality of barrier layers. A lens element is integrated with the VCSEL structure being etched directly into an uppermost surface of the second stack of distributed Bragg reflectors or etched into a layer of silicon nitride (SiN) disposed on an uppermost surface of the second stack of distributed Bragg reflectors.

10 Claims, 2 Drawing Sheets

VERTICAL CAVITY SURFACE EMITTING LASER WITH INTEGRATED DIFFRACTIVE LENS AND METHOD OF FABRICATION

FIELD OF THE INVENTION

This invention relates to vertical cavity surface emitting lasers and more specifically to vertical cavity surface emitting lasers and integrated lens elements.

BACKGROUND OF THE INVENTION

Recently, there has been interest in a new type of light emitting device called a vertical cavity surface emitting laser (VCSEL). Conventional VCSELs have several potential advantages, such as a planar construction, emitting light perpendicular to the surface of the die, and the possibility of array fabrication.

Typically, VCSELs include a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL is driven by current forced through the active region, typically achieved by providing a first contact on the reverse side of the substrate and a second contact on top of the second mirror stack.

The use of mirror stacks in VCSELs is well established in the art. Typically, mirror stacks are formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL typically uses an $Al_{x1}Ga_{1-x1}As\backslash Al_{x2}Ga_{1-x2}As$ material system wherein the different refractive index of each layer of a pair is achieved by altering the aluminum content x1 and x2 in the layers, more particularly the aluminum content x1 ranges from 0% to 50% and the aluminum content of x2 ranges from 50% to 100%. In conventional devices, the number of mirror pairs per stack may range from 20–40 pairs to achieve a high percentage of reflectivity, depending on the difference between the refractive indices of the layers. The large number of pairs increases the percentage of reflected light.

One application for VCSELs that is becoming quite common is in the optical communication field where optical fibers are utilized. In utilizing optical fibers for communications, it is desired to have the highest possible coupling efficiency between the light source(s) and the fibers. In free space optical communications it is desired to collimate the beam of light emitted by the light source(s). When a conventional VCSEL is utilized as the light source, an external lens or lens array is used to either focus an emitted beam of light into the fibers, or collimate the beam into the receivers directly in the free space. This external lens or lens array is often quite bulky and does not lend itself to a small overall package size.

In an effort to reduce the size of the package and the cost of manufacture, is has been suggested to use the VCSEL substrate as a lens using photolithography etching methods. This technique works for lasers of 980 nm or longer in that when formed on a transparent GaAs substrate, the substrate does not absorb the laser emission, thus the light is emitted through the lens formed on the GaAs substrate. When a VCSEL of 850 nm or shorter is utilized, the VCSEL emits in an upward direction, opposite the substrate element, and does not pass therethrough the GaAs substrate. This upward emission is a requirement in that the GaAs substrate is absorptive to light in a wavelength of 850 nm or shorter.

Therefore, it can be readily be seen that a conventional VCSEL that has integrated as a part thereof a lens element formed on a substrate element cannot be utilized in a VCSEL that emits light of 850 nm or less. Thus, there is a need for developing a reliable, stable and cost effective vertical cavity surface emitting laser (VCSEL), that includes an integrated lens element for VCSELs that emit light of a short wavelength, more particularly light having a wavelength of 880 nm or less.

It would be highly advantageous, therefore, to remedy the foregoing and other deficiencies inherent in the prior art. Accordingly, it is an object of the present invention to provide a new and improved VCSEL with integrated lens element for use in short wavelength VCSEL applications.

Another object of the invention is to provide a reliable VCSEL with integrated lens element for optical communications applications.

And another object of the immediate invention is to provide for a VCSEL with integrated lens element that provides for beam focusing or beam collimation of short wavelength emitted light.

Yet another object of the invention is to provide for a highly manufacturable VCSEL with an integrated lens element.

SUMMARY OF THE INVENTION

Briefly, to achieve the desired objects of the instant invention in accordance with a preferred embodiment thereof, provided is a VCSEL with an integrated lens element. The VCSEL generally includes a substrate, a first stack of distributed Bragg reflectors, an active region, and a second stack of distributed Bragg reflectors. In a preferred embodiment, the VCSEL structure includes a lens element integrated with the structure either etched into an uppermost portion of the second stack of distributed Bragg reflectors or alternatively etched into a layer of silicon nitride (SiN) deposited on the second stack of distributed Bragg reflectors.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawing, in which.

DETAILED DESCRIPTION OF THE DRAWING

Figure 1:
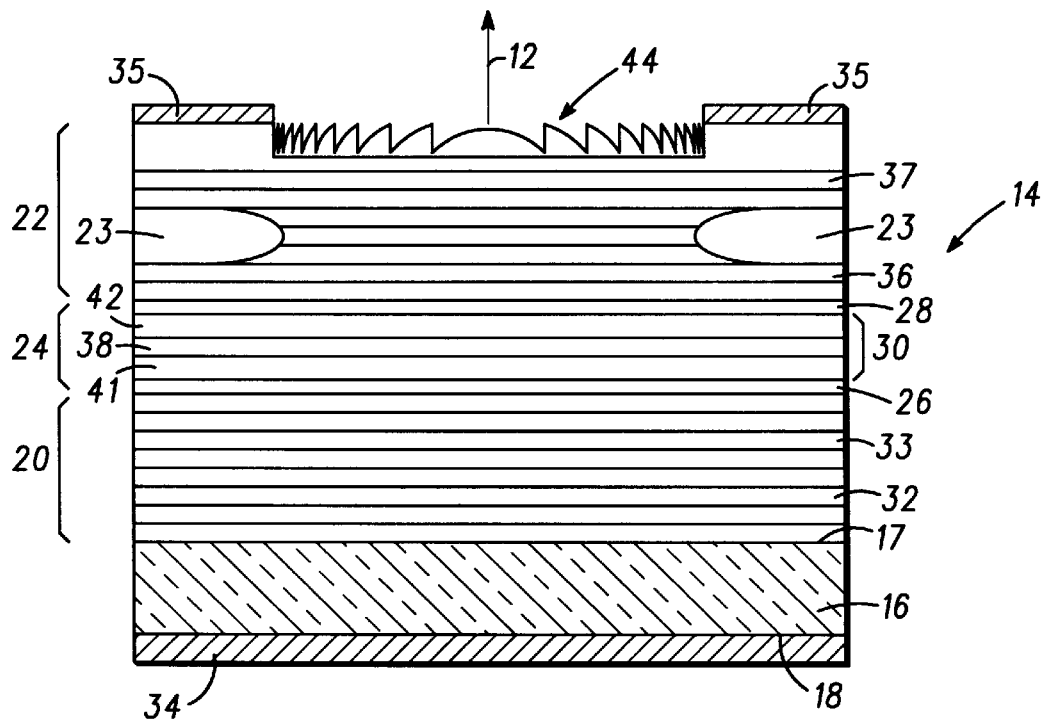
FIG. 1 is a cross-sectional view of a VCSEL structure with integrated lens element in accordance with the present invention.

FIG. 1 is a greatly enlarged simplified cross-sectional view of a vertical cavity surface emitting laser (VCSEL) 10 with light 12 being emitted therefrom. VCSEL 10 is defined by a wafer structure 14, which in this particular embodiment is formed as a planar wafer structure. As shown in FIG. 1, VCSEL 10 is made of several main elements or features, such as a substrate 16 having surfaces 17 and 18, a plurality of stacks 20 and 22 of distributed Bragg reflectors, an active region 24, including a plurality of cladding regions 26 and 28, and an active area 30, and a plurality of contact regions 34 and 35 in electrical cooperation with active region 24. Stacks 20 and 22 of distributed Bragg reflectors each include a plurality of alternating layers illustrated by layers 32 and 33, and layers 36 and 37, respectively. Active area 30 includes at least one quantum well layer 38 and barrier layers 41 and 42 with quantum well layer 38 being positioned between barrier layers 41 and 42.

Wafer structure 14 is formed on a substrate 16, which in this specific embodiment is gallium arsenide (GaAs). GaAs is preferably used to facilitate lattice matching of the components of wafer structure 14 which in this particular embodiment emits infrared wavelength light, more particularly light less than 880 nm, dependent upon the specific material system used. A GaAs substrate is utilized so as to facilitate epitaxial growth of subsequent multiple layers that compose wafer structure 14, thus device 10. In that GaAs is absorptive to short wavelength light, more particularly light with a wavelength of 850 nm or less, light 12 is emitted upward, in a direction opposite substrate 16. It should be understood that GaAs is only utilized as an example and other semiconductor materials may be employed as substrate 16, such as silicon (Si), indium phosphide (InP), or the like. Additionally, dependent upon material system, any wavelength emission is achievable by the structure disclosed in the present invention.

Typically, any suitable epitaxial deposition method, such as molecular beam epitaxy (MBE), metal organic chemical vapor deposition (MOCVD), or the like is used to make the required multiple layers for wafer structure 14. These methods allow for the epitaxial deposition of material layers, such as aluminum gallium arsenide, aluminum arsenide, indium aluminum gallium phosphide, gallium arsenide, indium gallium phosphide, indium gallium arsenide nitride, indium gallium arsenide, indium gallium aluminum arsenide, indium gallium arsenide aluminum nitride, aluminum gallium phosphide, indium aluminum phosphide, and the like. It should be understood that epitaxial deposition is used extensively to produce the multitude of layers that comprise complete VCSEL device 10 of the present invention.

Substrate 16 has an upper surface 17 and a lower surface 18. There is disposed on upper surface 17, first stack 20 of distributed Bragg reflectors. Active region 24 is disposed on stack 20 of distributed Bragg reflectors. Active region 24 includes active structure 30 sandwiched between first cladding region 26, adjacent first stack 20 of distributed Bragg reflectors, and second cladding region 28. Second stack 22 of distributed Bragg reflectors is disposed on second cladding region 28.

Referring now to stacks 20 and 22 of distributed Bragg reflectors, it should be understood that first stack 20 of distributed Bragg reflectors is deposited first with subsequent deposition defining cladding region 26, active structure 30, cladding region 28, and second stack 22 of distributed Bragg reflectors. First and second stacks 20 and 22 of distributed Bragg reflectors are each composed of a plurality of layers, 32 and 33, and 36 and 37, respectively. Generally, thicknesses of alternating layers 32, 33, 36, and 37 are typically set as portions of a wavelength of light (not shown) that the complete VCSEL device 10 is designed to emit. Thus, specific thicknesses of the alternating layers 32, 33, 36, and 37 are a function of the designed wavelength at which VCSEL 10 is to operate. Typically, the most common wavelength values used are one-quarter, one-half, three-quarters, full wavelength, or any multiples thereof. In a preferred embodiment of the present invention, one-quarter wavelength thicknesses are used.

Generally, doping of stacks 20 and 22 of distributed Bragg reflectors is split with one of the stacks of distributed Bragg reflectors being N-type and the other being P-type. Since doping levels are well known in the art, the doping levels will not be described herein other than to identify material either as undoped, P-typed doped such as with carbon (C), zinc (Zn) or the like, or N-typed doped such as with selenium (Se), silicon (Si), or the like. Briefly, in this particular embodiment, stack 20 of distributed Bragg reflectors and a portion of cladding region 26 are N-type doped, with a portion of cladding region 26, active structure 30, and a portion of cladding region 28 being undoped, and with a portion of cladding region 28, and second stack 22 of distributed Bragg reflectors being P-type doped.

In the present invention, first and second stacks 20 and 22 of distributed Bragg reflectors, having alternating layers 32, 33, 36, and 37, are made of any suitable materials, such as aluminum gallium arsenide (AlGaAs) with the aluminum percentage ranging from 0 to 100% or materials forming a mirror stack. For example, a GaAs based VCSEL typically uses an $Al_{x1}Ga_{1-x1}As\backslash Al_{x2}Ga_{1-x2}As$ material system wherein the different refractive index of each layer of a pair is achieved by altering the aluminum content x1 and x2 in the layers, more particularly the aluminum content x1 ranges from 0% to 50% and the aluminum content of x2 ranges from 50% to 100%. The number of mirror pairs per stack may range from 20–40 pairs to achieve a high percentage of reflectivity, depending on the difference between the refractive indices of the layers. In the embodiments disclosed in the present invention it is anticipated that second stack 22 of distributed Bragg reflectors can alternatively include a plurality of pairs of alternating layers of a dielectric material to be deposited as a final step in the device fabrication process. Furthermore, and as illustrated in FIG. 1, second stack 22 of distributed Bragg reflectors contains an implant region 23 within second stack 22 of distributed Bragg reflectors. Implant region 23 serves to enhance carrier confinement within device 10.

More specifically, a VCSEL structure designed to emit at 780 nm will include alternating layers 32, 33, 36, and 37 of $Al_{0.25}Ga_{0.75}As/Al_{0.95}Ga_{0.05}As$ or $Al_{0.25}Ga_{0.75}As/AlAs$. A VCSEL structure designed to emit at 850 nm will include alternating layers 32, 33, 36, and 37 of $Al_{0.15}Ga_{0.85}As/Al_{0.85}Ga_{0.15}As$. Irrespective of the material system utilized, layers 32 and 33 are epitaxially disposed or deposited on or overlaying substrate 16 and layers 36 and 37 are epitaxially disposed or deposited on or overlaying cladding region 28, thereby generating stacks 20 and 22 of distributed Bragg reflectors, respectively. It should be understood that while AlGaAs/AlAs DBR structures are utilized in the preferred embodiment, alternative DBR structures utilizing materials such as indium aluminum gallium phosphide and aluminum arsenide (e.g., $In_{0.49}Al_xGa_{0.51-x}P/AlAs$), aluminum gallium arsenide and aluminum arsenide ($Al_{0.05}Ga_{0.05}As/AlAs$)-, and indium aluminum gallium phosphide and indium aluminum phosphide (e.g., $In_{0.49}Al_xGa_{0.51-x}P/In_{0.49}Al_{0.51}P$) are anticipated by this disclosure for the device to operate at a red visible emission wavelength (635–700 nm) in association with an appropriate active medium. Additionally, it should be understood that in each of the above examples and throughout this disclosure where a percent composition of a particular element is given it should be considered only as an example. It should be further understood that variations from these examples can be large and are to be considered part of the present invention.

Stacks 20 and 22 of distributed Bragg reflectors are formed by depositing pairs of alternating layers using some convenient technique such as molecular beam epitaxy (MBE) or sputtering. In order to crystal lattice match stack 20 to substrate 16 a suitable semiconductor material system must be deposited. Approximately 20–40 mirror pairs of this material system are deposited on substrate 16 depending on the difference between the refractive indices of the layers. As will be explained presently, substrate doping is not necessary since electrical contacts to active region 24 can be made laterally to doped stack 20 of distributed Bragg reflectors.

For the sake of simplicity and to prevent overcrowding of the figure, cladding regions 26 and 28 are each shown as single layers; however, it should be understood that doping of cladding regions 26 and 28 is dependent upon whether cladding regions 26 and 28 are each made of a single layer or a plurality of layers. If cladding regions 26 and 28 are each made of a single layer, then cladding regions 26 and 28 are not doped. If cladding regions 26 and 28 include a plurality of layers, then at least a portion of the plurality of layers of cladding regions 26 and 28 are doped. With cladding regions 26 and 28 being made of a plurality of layers, the doping of the portion to be doped is consistent to its adjacent transition regions and its adjacent stack of distributed Bragg reflectors. In this particular embodiment cladding regions 26 and 28 are made of at least two components.

Multi-layer cladding region 26 is epitaxially disposed or deposited on stack 20 of distributed Bragg reflectors. First, a layer of any suitable material such as aluminum gallium arsenide (AlGaAs) having an appropriate thickness and being doped similarly to stack 20 of distributed Bragg reflectors is epitaxially deposited on stack 20 of distributed Bragg reflectors.

By way of example, a N-doped aluminum gallium arsenide layer (Al$_{0.60}$Ga$_{0.40}$As) is epitaxially deposited on stack 20 of distributed Bragg reflectors. Generally, the AlGaAs layer has a thickness that is determined by the wavelength of light that is to be emitted from the VCSEL structure, thereby allowing the thickness of the AlGaAs layer to be any suitable thickness. Second, a layer of any suitable material such as aluminum gallium arsenide (AlGaAs) having an appropriate thickness is epitaxially deposited on the first layer of the cladding region 26.

Active structure 30 is represented by a plurality of layers which are epitaxially deposited or disposed on cladding region 26. It should be understood that active structure 30 includes multiple barrier layers 41 and 42 with quantum well layer 38 disposed therebetween. By way of a simple example, active structure 30 includes at least two barrier layers 41 and 42 and at least one quantum well layer 38 with the quantum well layer being positioned between the barrier layers. In a VCSEL structure that emits at 780 nm, the quantum well layer(s) are made of undoped aluminum gallium arsenide (Al$_{0.12}$Ga$_{0.88}$As) and the barrier layers are made of an aluminum gallium arsenide (Al$_{0.30}$Ga$_{0.70}$As). In a VCSEL structure that emits at 850 nm, the quantum well layer(s) are made of undoped gallium arsenide (GaAs) and the barrier layers are made of an aluminum gallium arsenide (Al$_{0.30}$Ga$_{0.70}$As). Typically, active structure 30 includes from one to five quantum well layers with their corresponding barrier layers. One skilled in the art will understand that more quantum well layers and barrier layers can be used depending upon the application. Active region 24 and first and second stacks 20 and 22 of distributed Bragg reflectors respectively are configured to emit light with a wavelength of approximately 780 nm or 850 nm.

For the sake of simplicity and to prevent overcrowding of the figure, cladding region 28 is shown as a single layer; however, as previously stated, it should be understood that cladding region 28 is made of multiple layers that are disposed or deposited epitaxially on active structure 30. First, a layer of any suitable undoped cladding material is epitaxially deposited to an appropriate thickness on active structure 30. Second, a layer of any suitable doped cladding material is epitaxially deposited on the undoped cladding material.

By way of example, an undoped aluminum gallium arsenide (Al$_{0.30}$Ga$_{0.70}$As) layer is epitaxially deposited on active structure 30. Generally, the undoped AlGaAs has a thickness that is determined by the wavelength of light that is to be emitted from the VCSEL device, thereby allowing the thickness of the AlGaAs layer to be any suitable thickness. Subsequently, a doped aluminum gallium arsenide (Al$_{0.60}$Ga$_{0.40}$As) layer is epitaxially deposited on the undoped layer. The doped layer is generally doped with a P-type dopant.

If desired, once the material layers have been fabricated on substrate 16, the material layers can be patterned by any suitable method or combination of methods, such as photolithography, etching, deposition, or the like, to form a ridge VCSEL (not shown) embodiment of the device shown. For example, a dot pattern can be formed by a photolithography process on the material layers where portions of the material layers are exposed and where portions of the material layers are covered by the dot pattern. The dot pattern is then etched by any suitable technique such as dry etching or wet etching where the portions that are exposed are removed while the covered portions are not removed, thereby forming a ridge structure.

To complete wafer structure 14, more particularly device, 10, an electrical contact 34 is coupled to a surface 18 of substrate 16. A second electrical contact 35 is coupled to distributed Bragg reflector 22. As previously stated, light 12 is emitted from device 10 in a direction opposite substrate 16. Various changes and modifications to the embodiments herein chosen for purposes of illustration will readily occur to those skilled in the art. For example, it should be understood that VCSEL structure symmetry exists for both the p and n dopants as well as electrically inverted structure designs.

Figure 2:
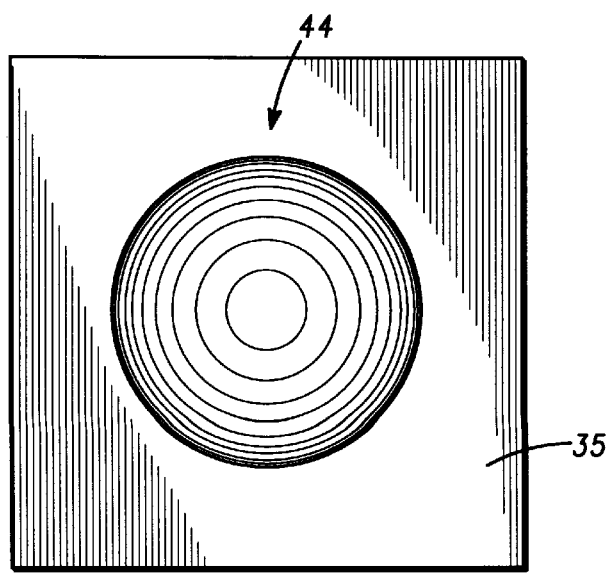
FIG. 2 is a top view of the lens surface of the device of FIG. 1.

Once VCSEL device 10 is fabricated according to the above detailed structure, a lens element 44 is integrated with device 10. As illustrated in FIG. 1, lens element 44 is integrated with device 10 by etching into an uppermost surface, or layer, of second stack 22 of distributed Bragg reflectors, a diffractive planar lens element 44. Referring now to FIG. 2, illustrated is a top view of device 10 showing the fabrication of lens element 44 relative to second contact 35 of device 10. Lens element 44 is etched into uppermost surface of second stack 22 of distributed Bragg reflectors using well known photolithography methods such as electron-beam or e-beam photolithography, focused ion beam cutting/etching techniques, x-ray photolithography, or the like.

Once complete, device 10, more particularly lens element 44, is capable of focusing and/or collimating laser emission 12 without the necessity for an external lens or lens array, thereby simplifying and reducing the size of the overall structure of device 10. By integrating lens element 44 with VCSEL wafer structure 14, laser emission 12 passes through lens element 44 as it exits the structure.

Figure 3:
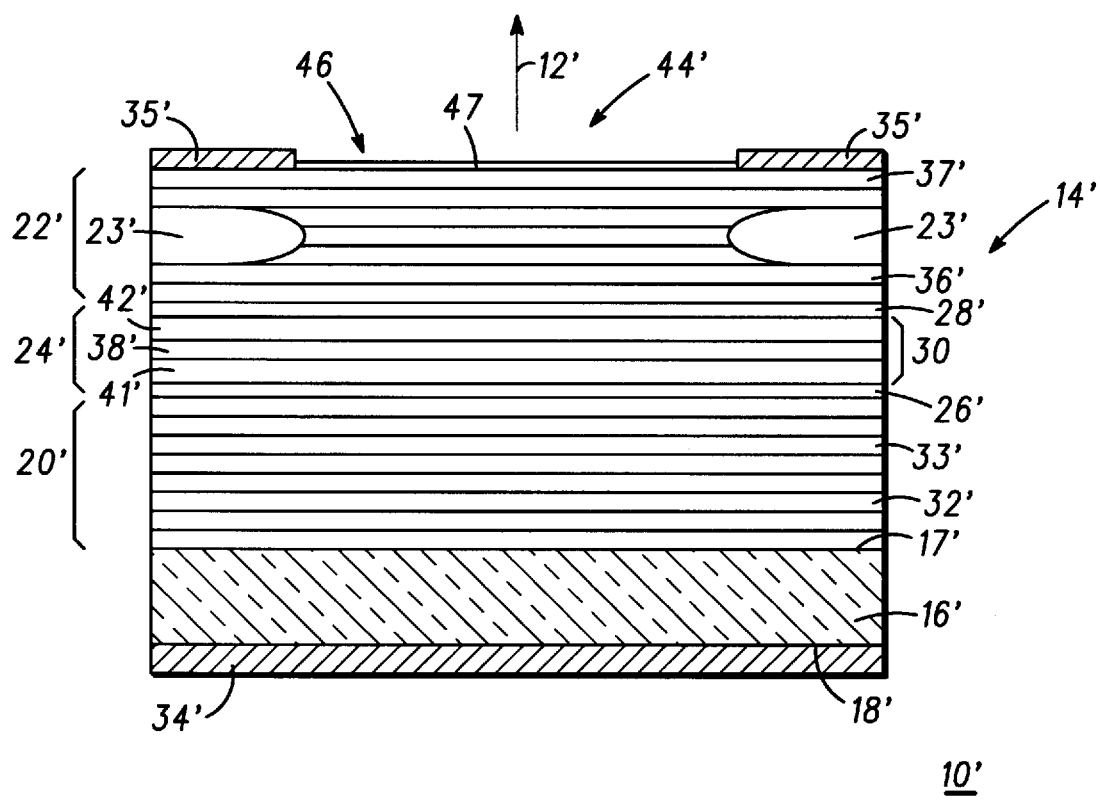
FIG. 3 is a cross-sectional view of an alternative VCSEL structure with integrated lens element in accordance with the present invention.

Referring now to FIG. 3, illustrated in simplified cross-sectional view is an alternative embodiment of a VCSEL device with an integrated lens element according to the present invention. It should be noted that all components similar to the components illustrated in FIGS. 1 and 2 are designated with similar numbers, having a prime added to indicate the different embodiment. Accordingly, illustrated is VCSEL device 10' with light 12' being emitted therefrom. VCSEL 10' is fabricated generally similar to device 10 of FIG. 1. More specifically, VCSEL 10' is defined by a wafer structure 14', which in this particular embodiment is formed as a planar wafer structure. As shown in FIG. 3, VCSEL 10' is made of several main elements or features, such as a substrate 16' having surfaces 17' and 18', stacks 20' and 22' of distributed Bragg reflectors, active region 24', including cladding regions 26' and 28', and active area 30', and contact regions 34' and 35'. Stacks 20' and 22' of distributed Bragg reflectors each include a plurality of alternating layers illustrated by layers 32' and 33', and layers 36' and 37', respectively. Active area 30' includes at least one quantum well layer 38' and barrier layers 41' and 42' with quantum well layer 38' being positioned between barrier layers 41' and 42'.

Once wafer structure 14' is fabricated according to the disclosed methods as detailed with regard to device 10 of FIG. 1, a layer 47 of silicon nitride (SiN) is deposited within an emission aperture 46 defined by contacts 35'. Layer 47 of silicon nitride (SiN) is deposited according to well known methods in the art for epitaxial deposition. A lens element 44' is then defined in layer 47 of silicon nitride (SiN) by etching into layer 47. Lens element 44' in a preferred embodiment is defined as including diffractive optical properties. Thus, a VCSEL device 10' with an integrated lens element 44' is defined. Lens element 44' is fabricated in a path of the laser emission 12', thereby focusing and/or collimating laser emission 12' as it passes therethrough second stack 22' of distributed Bragg reflectors and layer 47 of silicon nitride (SiN) with lens element 44' defined therein.

By now it should be appreciated that a novel article and method for making the article have been provided. A vertical cavity surface emitting laser with an integrated diffractive lens element is disclosed having improved performance in terms of the ability to focus and/or collimate the laser emission generated therein without the need for an external lens or lens array.

The various steps of the method disclosed have been performed in a specific order for purposes of explanation, however, it should be understood that various steps of the disclosed method may be interchanged and/or combined with other steps in specific applications and it is fully intended that all such changes in the disclosed methods come within the scope of the claims.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A vertical cavity surface emitting laser device comprising:
   a substrate having a surface;
   a first stack of distributed Bragg reflectors disposed on the surface of the substrate;
   an active region disposed on the first stack of distributed Bragg reflectors;
   a second stack of distributed Bragg reflectors disposed on the active region, the first stack of distributed Bragg reflectors, the active region and the second stack of distributed Bragg reflectors defining an optical cavity and generating a laser emission along a path; and
   a diffractive lens element, formed in a layer of silicon nitride (SiN) deposited on an uppermost surface of the second stack of distributed Bragg reflectors and within an emission aperture, the diffractive lens element focusing the laser emission as it passes therethrough the diffractive lens element, at a point external the defined optical cavity.

2. A vertical cavity surface emitting laser device as claimed in claim 1 wherein the laser is fabricated to emit light with a wavelength of 880 nm or less.

3. A vertical cavity surface emitting laser device as claimed in claim 1 wherein the laser is defined by a planar wafer structure and the diffractive lens element is defined by a planar structure.

4. A vertical cavity surface emitting laser device as claimed in claim 1 wherein the laser is defined by a ridge wafer structure and the diffractive lens element is defined by a planar structure.

5. A vertical cavity surface emitting laser device as claimed in claim 1 wherein the lens element is fabricated using electron beam photolithography.

6. A vertical cavity surface emitting laser device as claimed in claim 1 wherein the diffractive lens element is fabricated using focused ion beam cutting/etching.

7. A vertical cavity surface emitting laser device as claimed in claim 1 wherein the diffractive lens element is fabricated using x-ray lithography.

8. A vertical cavity surface emitting laser device comprising:
   a substrate having a surface;
   a first stack of distributed Bragg reflectors including a plurality of pairs of alternating layers disposed on the surface of the substrate, the first stack of distributed Bragg reflectors having a surface;
   an active region having a first and a second surface and including an active structure sandwiched between a first cladding region and a second cladding region, the active structure including at least one quantum well structure and a plurality of barrier layers, the active region being lattice matched to the surface of the first stack of distributed Bragg reflectors;
   a second stack of distributed Bragg reflectors lattice matched to the second surface of the active region and including a plurality of pairs of alternating layers, the first stack of distributed Bragg reflectors, the active region and the second stack of distributed Bragg reflectors defining an optical cavity; and
   a diffractive planar lens element etched into a layer of silicon nitride (SiN) directly deposited on an uppermost surface of the second stack of distributed Bragg reflectors, and within a path of emission generated by the vertical cavity surface emitting laser, the diffractive planar lens element focusing the emission at a point external the defined optical cavity.

9. A vertical cavity surface emitting laser device as claimed in claim 8 wherein the active region and the first and second stacks of distributed Bragg reflectors are configured to emit light with a wavelength of 880 nm or less.

10. A vertical cavity surface emitting laser device as claimed in claim 8 wherein the diffractive planar lens element is fabricated using one of electron beam photolithography, focused ion beam cutting/etching, and x-ray lithography.

* * * * *